US009380867B2

(12) United States Patent
Plikat et al.

(10) Patent No.: US 9,380,867 B2
(45) Date of Patent: Jul. 5, 2016

(54) PARTITION SYSTEM AND ACCESSORIES FOR USE THEREWITH

(71) Applicant: Herman Miller, Inc., Zeeland, MI (US)

(72) Inventors: Claudia Plikat, Berlin (DE); Johann Burkhard Schmitz, Berlin (DE); Carola Eva Marianne Zwick, Berlin (DE); Roland Rolf Otto Zwick, Berlin (DE); Janja Maidl, Berlin (DE)

(73) Assignee: Herman Miller, Inc., Zeeland, MI (US)

( * ) Notice: Subject to any disclaimer, the term of this patent is extended or adjusted under 35 U.S.C. 154(b) by 0 days.

(21) Appl. No.: 14/011,359

(22) Filed: Aug. 27, 2013

(65) Prior Publication Data

US 2014/0165882 A1 Jun. 19, 2014

Related U.S. Application Data

(60) Provisional application No. 61/693,489, filed on Aug. 27, 2012.

(51) Int. Cl.
*A47B 5/00* (2006.01)
*A47B 13/02* (2006.01)
(Continued)

(52) U.S. Cl.
CPC . *A47B 13/02* (2013.01); *A47B 5/06* (2013.01); *A47B 13/003* (2013.01); *A47B 21/02* (2013.01); *A47B 21/06* (2013.01); *A47B 83/001* (2013.01); *A47B 96/027* (2013.01); *A47B 97/04* (2013.01); *F16M 11/04* (2013.01); *F16M 11/22* (2013.01);

(Continued)

(58) Field of Classification Search
CPC ........ A47B 5/06; A47B 83/001; A47B 83/04; A47B 21/06; A47B 96/04; A47B 5/02; A47F 7/145; E04B 2/7405
USPC ........ 108/48, 152, 145, 154, 159.12, 34, 117; 312/277, 194, 195
See application file for complete search history.

(56) References Cited

U.S. PATENT DOCUMENTS

D53,058 S   3/1919  Weinberg
1,647,889 A  11/1927  Saunders
(Continued)

FOREIGN PATENT DOCUMENTS

AU  2009217472 A1  4/2011
DE     2345934 A1  3/1975
(Continued)

OTHER PUBLICATIONS

International Search Report issued in PCT Patent Application No. PCT/US2013/056787, mailed Jul. 23, 2014, 8 pages.
(Continued)

*Primary Examiner* — Daniel J Troy
*Assistant Examiner* — Andres F Gallego
(74) *Attorney, Agent, or Firm* — Michael Best & Friedrich LLP

(57) ABSTRACT

A partition system includes various accessories that may be associated with a wall or base element. The accessories include without limitation a power strip, an adjustable shelf, various backdrops and a worksurface assembly. The wall element may be curved or linear in various embodiments. The wall element may include an upstanding wall or a channel, either or both of which are engaged by one or more accessories. In some embodiments, the accessories may be co-located at a single location, with one or more accessories accommodating the others with an expansion device.

21 Claims, 12 Drawing Sheets

(51) Int. Cl.

| | | |
|---|---|---|
| A47B 5/06 | (2006.01) | |
| A47B 96/02 | (2006.01) | |
| A47B 21/06 | (2006.01) | |
| A47B 83/00 | (2006.01) | |
| A47B 13/00 | (2006.01) | |
| A47B 21/02 | (2006.01) | |
| A47B 97/04 | (2006.01) | |
| F16M 11/04 | (2006.01) | |
| F16M 11/22 | (2006.01) | |
| H02G 3/38 | (2006.01) | |

(52) U.S. Cl.
CPC .......... *H02G 3/386* (2013.01); *A47B 2021/066* (2013.01); *H02G 3/286* (2013.01)

(56) References Cited

U.S. PATENT DOCUMENTS

| | | | |
|---|---|---|---|
| 1,694,520 A | 12/1928 | Sturdavant | |
| 1,720,136 A | 7/1929 | Neumann | |
| D82,098 S | 9/1930 | Marsh | |
| D86,761 S | 4/1932 | Brooks | |
| 1,937,981 A | 12/1933 | Rosenthal | |
| D98,297 S | 1/1936 | Early | |
| 2,129,396 A | 9/1938 | Archer | |
| D115,351 S | 6/1939 | Rask | |
| D140,244 S | 2/1945 | Wemyss | |
| D144,591 S | 4/1946 | Schutes | |
| D157,082 S | 1/1950 | Patton | |
| D161,333 S | 12/1950 | Gooken | |
| D180,106 S | 4/1957 | Seifert | |
| 2,889,055 A | 6/1959 | Weller et al. | |
| D189,171 S | 11/1960 | Ensign | |
| D189,245 S | 11/1960 | Hunting, Sr. | |
| 3,171,543 A | 3/1965 | Nelson et al. | |
| D211,546 S | 6/1968 | Reibold et al. | |
| D211,548 S | 6/1968 | Hayes | |
| D212,267 S | 9/1968 | Dreyfuss | |
| 3,519,320 A | 7/1970 | Freedman | |
| 3,811,728 A | 5/1974 | Redemske | |
| D232,142 S | 7/1974 | Spydevold | |
| D233,579 S | 11/1974 | Lindbo | |
| 3,871,435 A | 3/1975 | Lopatka | |
| D240,098 S | 6/1976 | Juhlin | |
| D246,323 S | 11/1977 | Kirk | |
| D253,152 S | 10/1979 | Berlic | |
| 4,203,239 A | 5/1980 | Williams et al. | |
| 4,224,769 A | 9/1980 | Ball et al. | |
| 4,325,597 A | 4/1982 | Morrison | |
| D265,701 S | 8/1982 | Colquhoun | |
| D266,210 S | 9/1982 | Hannecke | |
| 4,382,642 A * | 5/1983 | Burdick | 312/194 |
| D272,834 S | 2/1984 | Moore | |
| 4,460,097 A | 7/1984 | Darnell, II et al. | |
| 4,534,473 A | 8/1985 | Post | |
| 4,545,632 A | 10/1985 | Maier et al. | |
| D281,209 S | 11/1985 | Burns | |
| 4,579,399 A | 4/1986 | Poltash | |
| D299,990 S | 2/1989 | Everett | |
| D300,489 S | 4/1989 | Antonellis | |
| D301,189 S | 5/1989 | Wallace | |
| 4,876,835 A | 10/1989 | Kelley et al. | |
| 4,925,038 A | 5/1990 | Gajewski | |
| 5,016,405 A | 5/1991 | Lee | |
| D319,361 S | 8/1991 | Moser | |
| D327,385 S | 6/1992 | Allen | |
| D334,306 S | 3/1993 | Breen | |
| 5,287,666 A | 2/1994 | Frascaroli et al. | |
| 5,392,575 A | 2/1995 | Hoffman et al. | |
| D358,067 S | 5/1995 | Graves | |
| 5,423,597 A | 6/1995 | Rogers | |
| 5,428,928 A * | 7/1995 | Hellwig | A47B 21/06 108/147 |
| D368,388 S | 4/1996 | Schainholz | |
| 5,553,934 A | 9/1996 | Wells et al. | |
| 5,715,633 A | 2/1998 | Raz et al. | |
| D395,367 S | 6/1998 | DePottey et al. | |
| 5,788,521 A | 8/1998 | Milan | |
| D397,561 S | 9/1998 | DePottey et al. | |
| 5,836,112 A | 11/1998 | Lindale et al. | |
| 5,857,742 A | 1/1999 | Karl et al. | |
| 5,885,109 A | 3/1999 | Lee et al. | |
| 5,915,571 A | 6/1999 | Czalkiewicz et al. | |
| 5,938,048 A | 8/1999 | Carroll et al. | |
| D415,580 S | 10/1999 | Keating et al. | |
| 5,974,985 A * | 11/1999 | Flototto et al. | 108/157.18 |
| 5,983,574 A | 11/1999 | Holztrager | |
| 6,047,750 A | 4/2000 | Jensen | |
| 6,105,796 A | 8/2000 | Buchanan et al. | |
| 6,138,583 A | 10/2000 | Mahone et al. | |
| 6,151,852 A | 11/2000 | Linn et al. | |
| D435,181 S | 12/2000 | Brozak, Jr. | |
| D435,865 S | 1/2001 | La Greca | |
| 6,276,102 B1 | 8/2001 | Shipman et al. | |
| 6,349,507 B1 | 2/2002 | Muellerleile | |
| 6,427,853 B2 | 8/2002 | Brozak, Jr. | |
| 6,434,890 B1 | 8/2002 | Konnerth | |
| 6,460,470 B1 | 10/2002 | Scharer et al. | |
| 6,486,407 B1 | 11/2002 | Hawker et al. | |
| 6,536,358 B1 | 3/2003 | Fears | |
| 6,629,386 B1 | 10/2003 | Cornell et al. | |
| 6,659,410 B1 * | 12/2003 | Lu | 248/188 |
| 6,712,433 B2 * | 3/2004 | Hellwig et al. | 312/223.6 |
| 6,750,410 B2 | 6/2004 | Lee | |
| D492,964 S | 7/2004 | Kuehl et al. | |
| D494,776 S | 8/2004 | Metz | |
| 6,805,249 B1 | 10/2004 | Houle | |
| 6,851,226 B2 | 2/2005 | MacGregor et al. | |
| 6,929,131 B1 | 8/2005 | Landi | |
| D520,263 S | 5/2006 | Nobles et al. | |
| 7,051,482 B2 | 5/2006 | MacDonald et al. | |
| D526,819 S | 8/2006 | Lee et al. | |
| D527,207 S | 8/2006 | Lee et al. | |
| 7,213,885 B2 | 5/2007 | White, III et al. | |
| 7,258,555 B2 | 8/2007 | Tiesler et al. | |
| D551,002 S | 9/2007 | Snell | |
| D559,564 S | 1/2008 | Bakker et al. | |
| 7,347,493 B2 | 3/2008 | Mulmed | |
| 7,347,734 B1 | 3/2008 | Teitelbaum | |
| 7,371,122 B2 | 5/2008 | Ivanova et al. | |
| 7,374,425 B1 | 5/2008 | Kuo et al. | |
| D571,577 S | 6/2008 | Van Es | |
| D572,042 S | 7/2008 | Suzuki | |
| D572,043 S | 7/2008 | Suzuki | |
| 7,393,250 B2 | 7/2008 | Tanaka | |
| D575,556 S | 8/2008 | Rohkar, Jr. | |
| 7,461,484 B2 | 12/2008 | Battey et al. | |
| 7,497,740 B2 | 3/2009 | Mei et al. | |
| D590,635 S | 4/2009 | Beckerman | |
| D591,987 S | 5/2009 | Thompson | |
| 7,540,115 B2 | 6/2009 | Metcalf et al. | |
| 7,544,100 B2 | 6/2009 | Teitelbaum | |
| 7,581,650 B1 | 9/2009 | Shen | |
| 7,607,928 B2 | 10/2009 | Schriefer et al. | |
| D605,425 S | 12/2009 | Kelly | |
| D605,876 S | 12/2009 | Linder | |
| 7,625,241 B2 | 12/2009 | Axland et al. | |
| 7,625,242 B2 | 12/2009 | Axland et al. | |
| 7,645,169 B2 | 1/2010 | Axland et al. | |
| D611,270 S | 3/2010 | Castillo Higareda | |
| D613,079 S | 4/2010 | Tsuchiyama | |
| D613,080 S | 4/2010 | Tsuchiyama | |
| D613,966 S | 4/2010 | Staw et al. | |
| 7,736,178 B2 | 6/2010 | Byrne | |
| D622,077 S | 8/2010 | Nash | |
| 7,775,379 B2 | 8/2010 | Hodge | |
| D624,334 S | 9/2010 | Linder | |
| D625,528 S | 10/2010 | Sprague | |
| 7,824,185 B2 | 11/2010 | Chien | |
| D629,228 S | 12/2010 | Allman et al. | |
| 7,874,856 B1 | 1/2011 | Schriefer et al. | |
| 7,955,106 B1 | 6/2011 | Crow et al. | |
| D642,814 S | 8/2011 | Pensi et al. | |
| 8,033,867 B1 | 10/2011 | Kessler et al. | |

(56) References Cited

U.S. PATENT DOCUMENTS

| | | |
|---|---|---|
| 8,118,616 B1 | 2/2012 | Clark |
| 8,157,574 B2 | 4/2012 | Hsiao |
| 2001/0013209 A1 | 8/2001 | Waalkes et al. |
| 2003/0024189 A1 | 2/2003 | Hughes et al. |
| 2004/0003556 A1 | 1/2004 | Zerbst |
| 2004/0064974 A1 | 4/2004 | Schuster |
| 2006/0225372 A1 | 10/2006 | Gonzalez |
| 2008/0078728 A1 | 4/2008 | Hodge |
| 2008/0212311 A1 | 9/2008 | Peterson |
| 2008/0232098 A1 | 9/2008 | Nelson et al. |
| 2009/0031653 A1 | 2/2009 | Nash |
| 2009/0141486 A1 | 6/2009 | Migli |
| 2011/0298339 A1 * | 12/2011 | Udagawa et al. ............ 312/111 |
| 2012/0028505 A1 | 2/2012 | Weber et al. |

FOREIGN PATENT DOCUMENTS

| | | | |
|---|---|---|---|
| DE | WO 0196684 A1 * | 12/2001 | ............ A47B 5/06 |
| DE | 20301298 U1 | 4/2003 | |
| DE | 202004008322 U1 | 7/2004 | |
| DE | 10311166 A1 | 12/2004 | |
| DE | 102006030086 A1 | 1/2008 | |
| DK | 128131 B | 3/1974 | |
| EP | 2153495 A2 | 2/2010 | |
| NL | 1033119 C2 | 6/2008 | |
| WO | WO 98/04790 A1 | 2/1998 | |
| WO | WO 98/54688 A1 | 12/1998 | |
| WO | WO 2008/148541 A2 | 12/2008 | |

OTHER PUBLICATIONS

Apartment Therapy, "Good Questions: Stepped Room Divider?," published prior to at least Aug. 27, 2013, 1 page.
Bookcase Superstore, "Guidecraft Book Display Children Bookcases", © 1997-2009, Mercantile, Inc., 6 pages.
Our House Ideas, "Rustic Step Shelf", Fact Sheets, published prior to at least Aug. 27, 2013, 1 page.
International Search Report for International Application No. PCT/DE2010/001059, dated Feb. 23, 2011, 2 pages.
International Preliminary Report on Patentability for International Application No. PCT/DE2010/001059, dated Mar. 13, 2012, 7 pages.
Office Action from Japanese Application No. 2011-012212, dated Dec. 27, 2011 with English translation and prior art dated Mar. 1, 2007 pictured on p. 2, 3 pages.

* cited by examiner

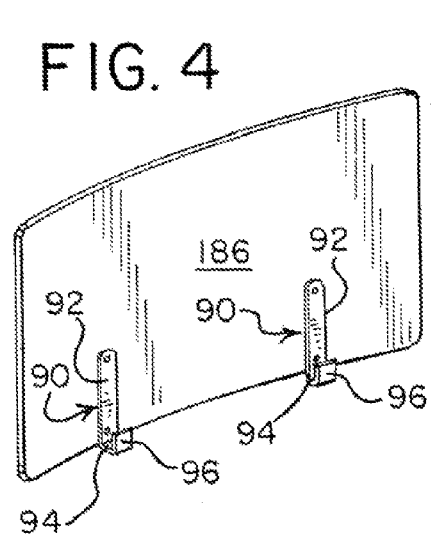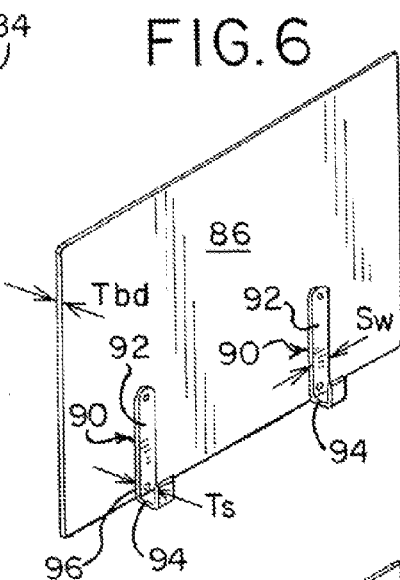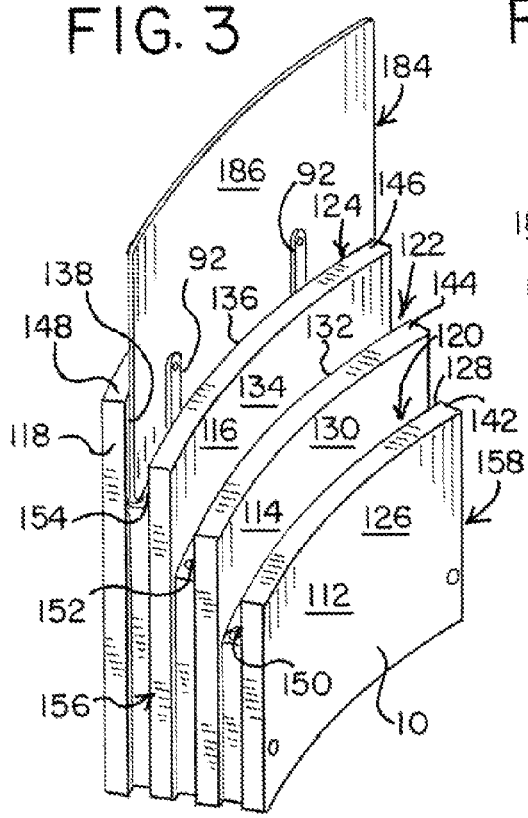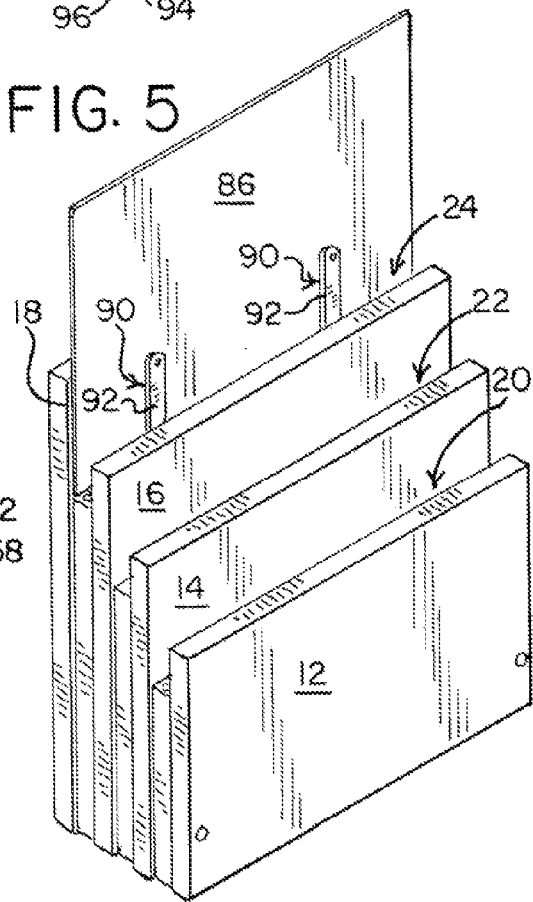

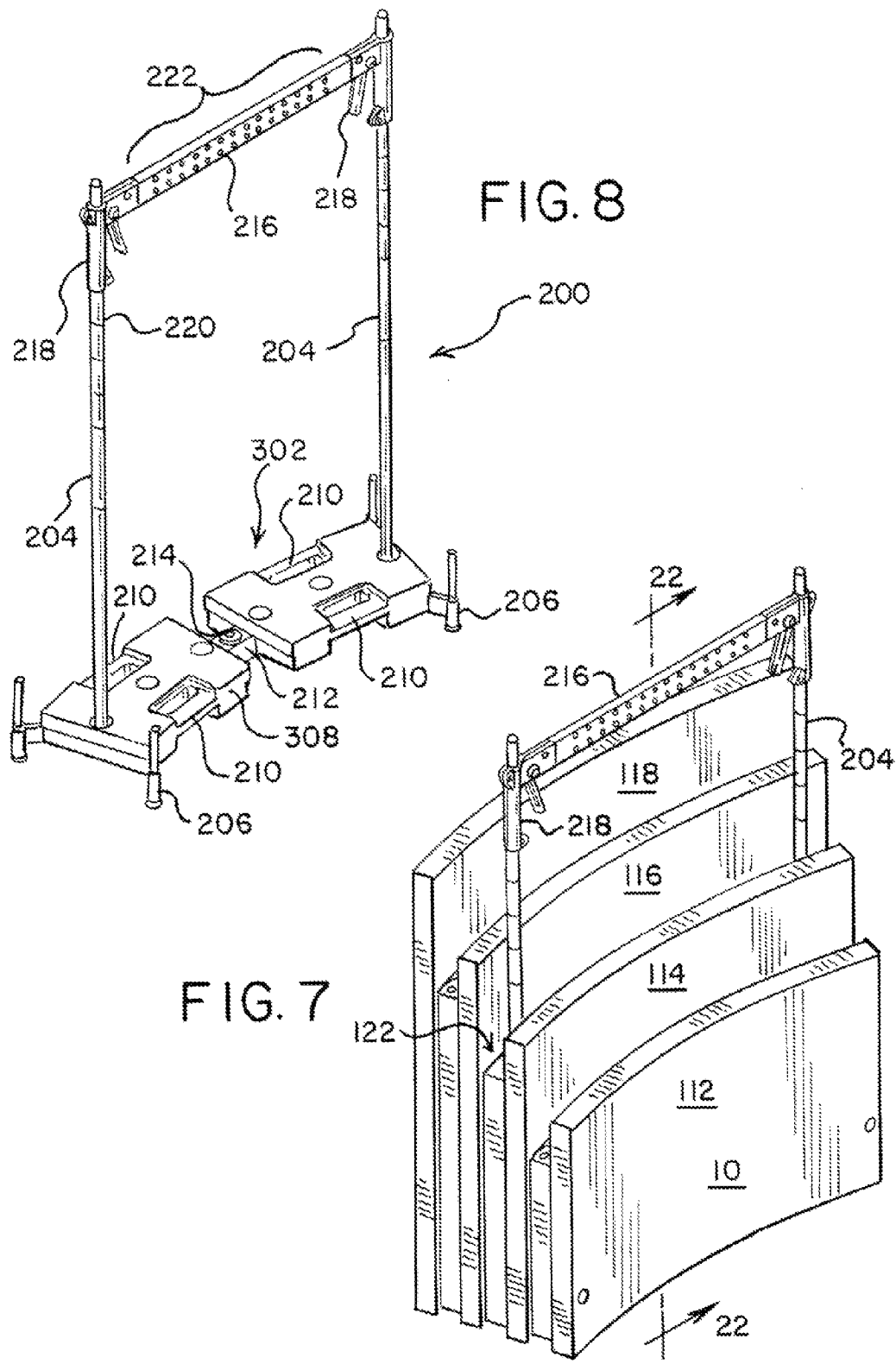

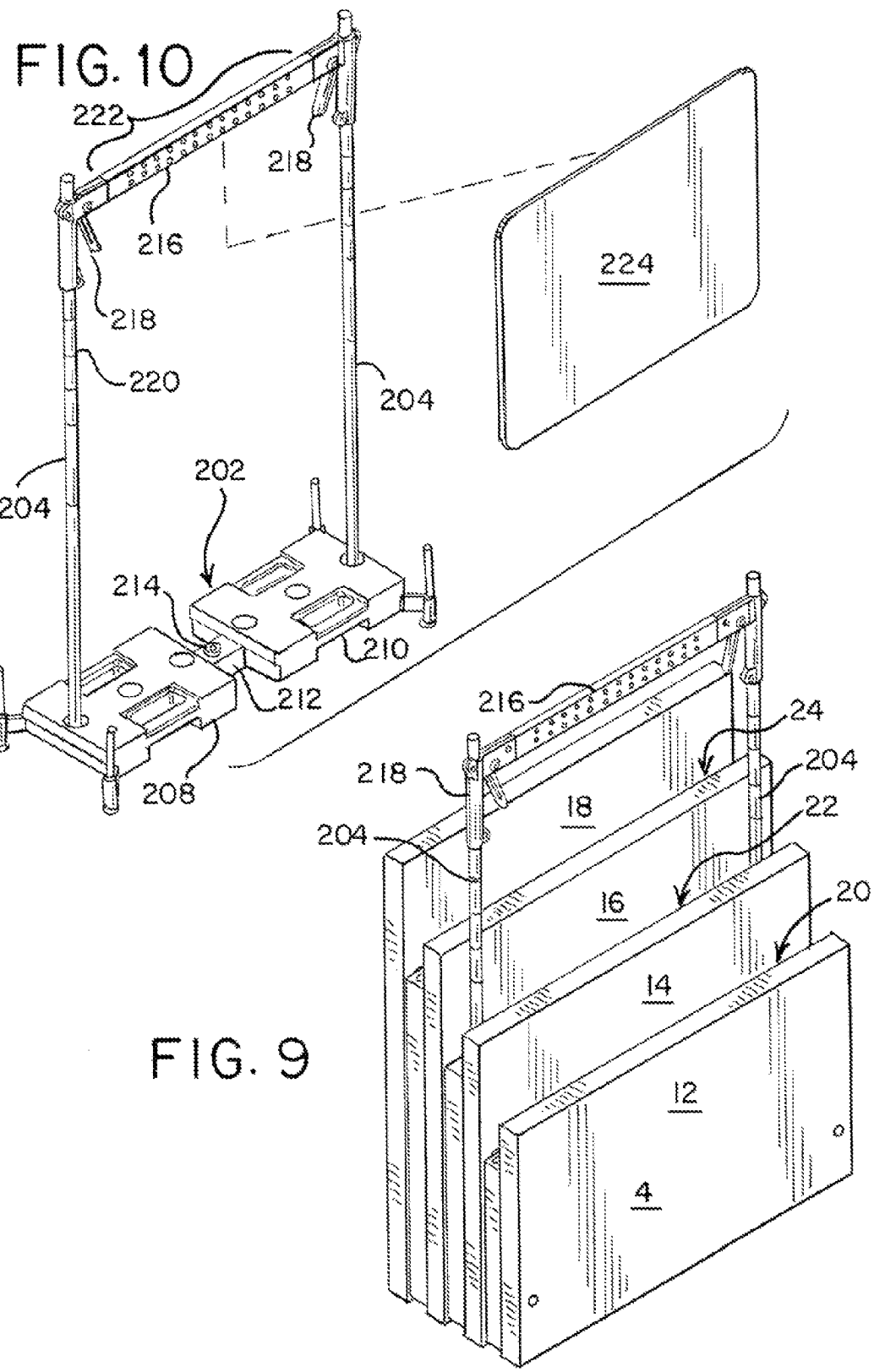

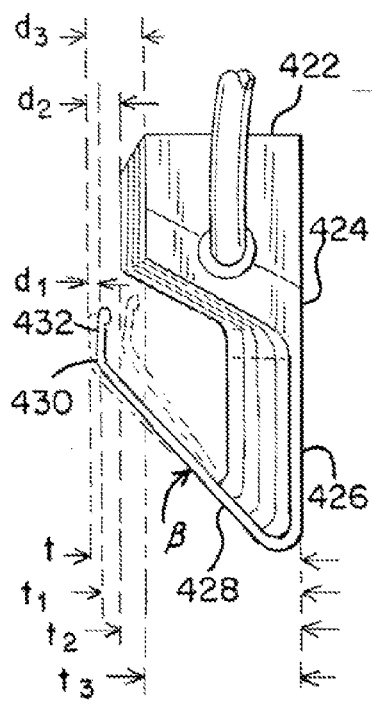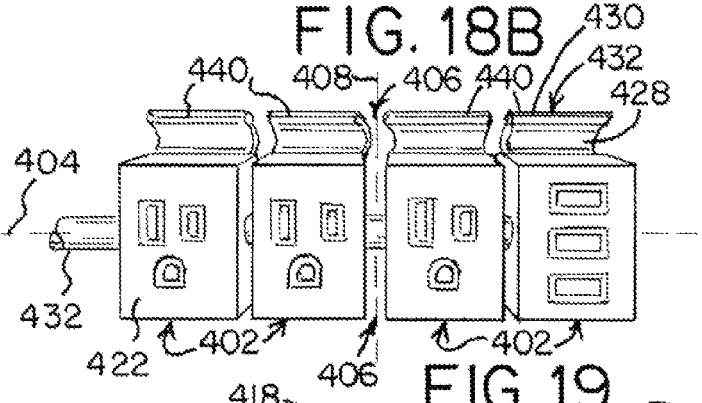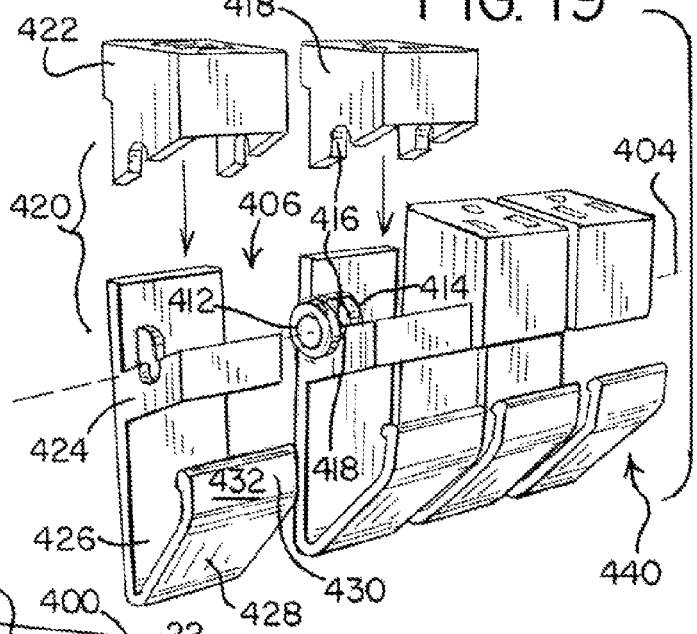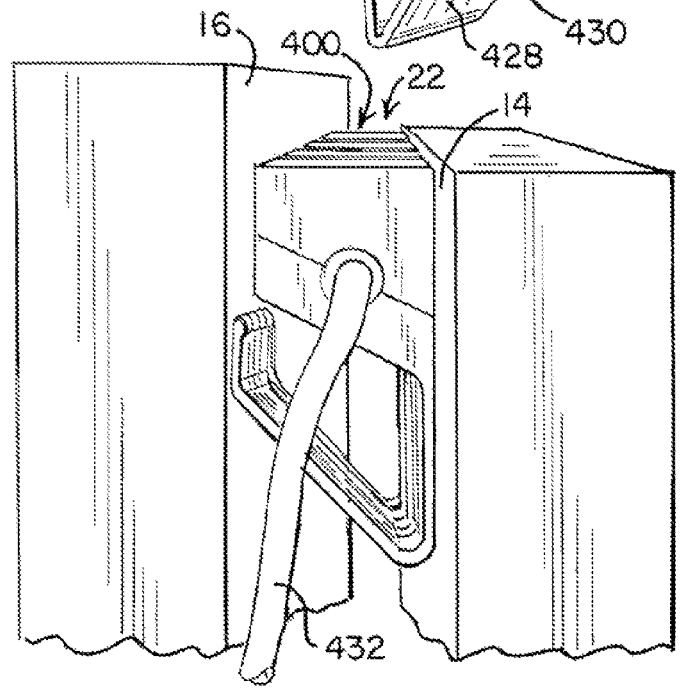

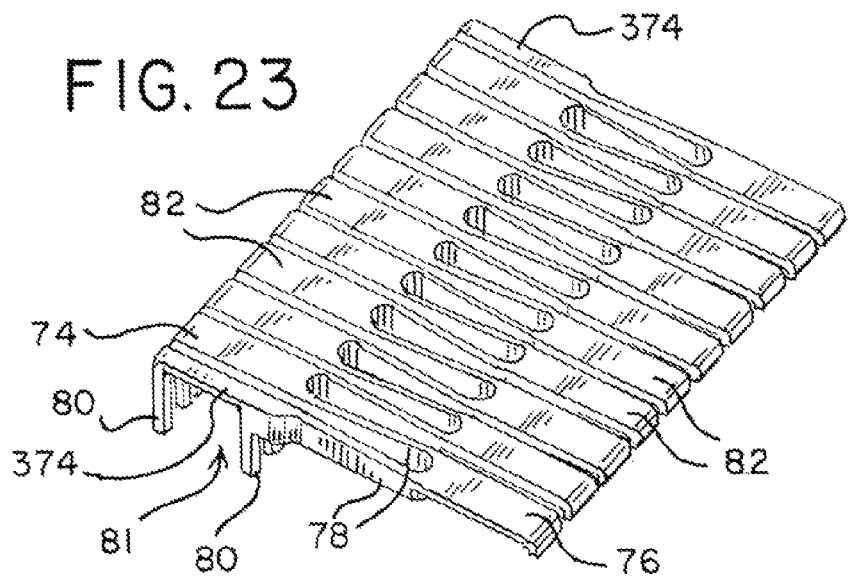
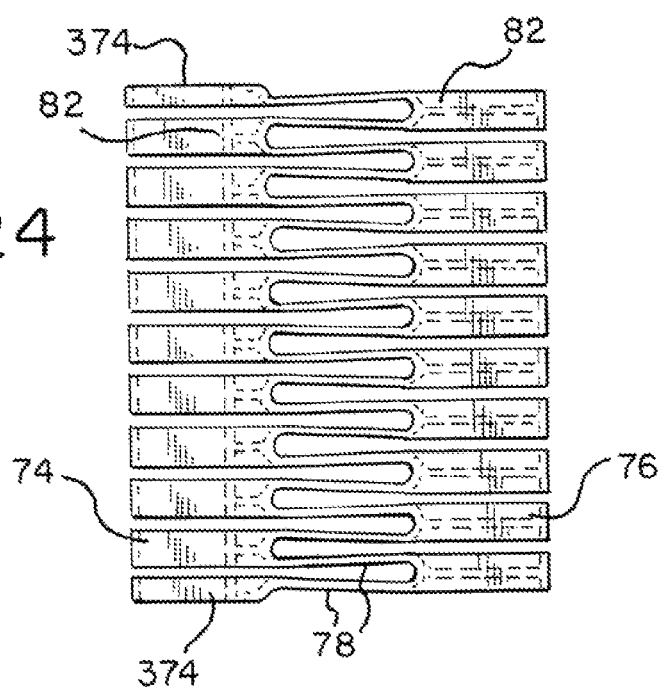
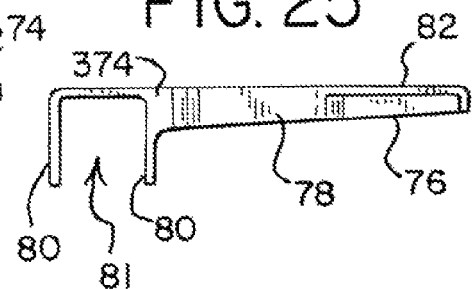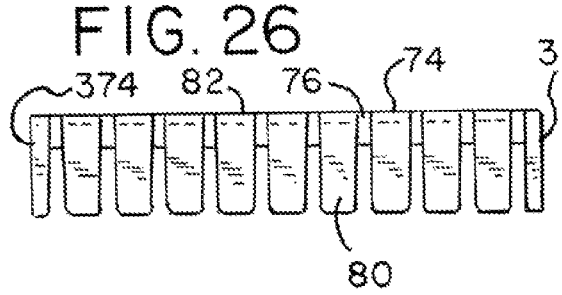

PARTITION SYSTEM AND ACCESSORIES FOR USE THEREWITH

This application claims the benefit of U.S. Provisional Application No. 61/693,489, filed Aug. 27, 2012, the entire disclosure of which is hereby incorporated herein by reference.

FIELD OF THE INVENTION

The invention relates to a partition system, and in particular to various accessories that may be used therewith.

BACKGROUND

Partition systems, such as that disclosed in U.S. Patent Publication No. 2012/0159869, entitled "Partition System," the entirety of which is hereby incorporated herein by reference, have been developed to divide and define various workspaces. In some embodiments, the partition system includes a plurality of wall elements merging one into another. Some of the wall elements may be linear, while others may be curved. This variation in shape may make it more difficult to accommodate and support various furniture components and accessories thereon, including various worksurfaces, backdrops, shelving and storage arrangements, power supply and the like. In addition, some of the wall elements may be configured with one or more channels, which support the accessories. Often, such channels are capable of supporting only one furniture component or accessory at a particular location, thereby limiting the utility and reconfigurability of the system. Thus, the need remains for various accessories that may be adapted for use with curved and linear wall elements, and which may be used in combination at a common location.

SUMMARY

In one aspect, one embodiment of an accessory includes a power strip having a plurality of power modules disposed along a longitudinal axis. Each of the modules has a length defined along the longitudinal axis and a width defined transverse to the length. At least one flexible joint pivotally connects adjacent pairs of the power modules such that the adjacent pairs of power modules are pivotable relative to each other about an axis substantially perpendicular to the longitudinal axis. At least one of the power modules includes an expansion component, which is adjustable such that the width of at least one power module is variable. In various aspects, the power strip is disposed in an elongated channel of a base structure. The channel may be curved or straight.

In another aspect, one embodiment of an adjustable shelf includes a plurality of elongated supports each having a mounting portion disposed adjacent one end of the elongated support and an opposite distal end portion. Each of the elongated supports includes an upper support surface. A plurality of flexible joints connect the mounting portions and the distal end portions, wherein the plurality of elongated supports may be arranged in a linear or curved configuration.

In yet another aspect, one embodiment of a furniture assembly includes a base having a channel with a bottom and opposite side walls defining a width of the channel. A support bracket includes an upright portion and a base portion disposed in the channel. A backdrop is coupled to the upright portion, wherein the base portion of the support bracket and the backdrop in combination have a thickness substantially equal to the width of the channel and engage the side walls of said channel such that the backdrop is removeably secured in the channel. In various embodiments, the channel may be straight or curved, with the backdrop also being straight or curved.

In yet another aspect, one embodiment of a furniture assembly includes a base having a wall with opposite sidewalls and an upper support surface. A claw defines a downwardly opening channel, which is received on the wall. A support member is coupled to the claw and extends laterally from the wall. A vertically adjustable leg supports the support member at a location laterally spaced from the base. A worksurface is supported by said support member. In various embodiments, the wall may be linear or curved.

In another aspect, a furniture assembly includes a base having a channel with opposite sidewalls defining a width and an upwardly opening mouth. A first auxiliary furniture component and a second auxiliary furniture component having an expansion device are disposed in the channel. The expansion device is adjustable such that a thickness of the first and second auxiliary furniture components in combination with the expansion device is substantially the same as the width of the channel, or alternatively, the thickness of the second auxiliary furniture component alone in combination with the expansion device is substantially the same as the width of the channel.

In yet another aspect, a furniture assembly includes a base defining an interior space and having an upper surface. A support stand includes a weighted base portion and a pair of spaced apart uprights extending upwardly from the weighted base portion. The weighted base portion and a portion of the uprights are disposed in the interior space of the base with said uprights extending upwardly through the upper surface. A cross bar is secured to, and bridges between, the uprights. The cross bar is adapted to support a media display, and is vertically adjustable along a length of the uprights. The base may be linear or curved.

The various aspects and embodiments provide significant advantages over other partition systems. For example and without limitation, the power strip, shelving arrangement, backdrop support and worksurface support may be used with both linear and curved base structures or wall elements. In this way, the furniture components, or accessories, are modular. In addition, the accessories may be used in combination at the same location, for example with the power strip positioned in alignment with and occupying the same space as one or more of the backdrop, shelving, and/or worksurface. Alternatively, the power strip, by way of the expansion device, may be used independently in the same space.

The foregoing paragraphs have been provided by way of general introduction, and are not intended to limit the scope of the following claims. The presently preferred embodiments, together with further advantages, will be best understood by reference to the following detailed description taken in conjunction with the accompanying drawings.

BRIEF DESCRIPTION OF THE DRAWINGS

FIG. 3 is a perspective view of a curved wall element with a curved backdrop applied thereto.

FIG. 4 is a perspective view of the curved backdrop.

FIG. 5 is a perspective view of a linear wall element with a straight backdrop applied thereto.

FIG. 6 is a perspective view of a straight backdrop.

FIG. 7 is a perspective view of a curved wall element with a media support stand applied thereto.

FIG. 8 is a perspective view of the support stand shown in FIG. 7.

FIG. 9 is a perspective view of a linear wall element with a media support stand applied thereto.

FIG. 10 is a perspective view of the support stand shown in FIG. 9.

FIG. 18A is a side view of the power strip shown in FIG. 17, with the expansion device shown in three different positions.

FIG. 18B is a front view of the power strip shown in FIG. 17.

FIG. 19 is a partially exploded perspective view of the power strip shown in FIG. 17.

FIG. 20 is a side view of the power strip disposed in a channel of a wall element.

FIG. 23 is a perspective view of an adjustable shelf.

FIG. 24 is a plan view of the adjustable shelf shown in FIG. 23.

FIG. 25 is a side view of the adjustable shelf shown in FIG. 23.

FIG. 26 is an end view of the adjustable shelf shown in FIG. 23.

DETAILED DESCRIPTION OF THE PRESENTLY PREFERRED EMBODIMENTS

Figure 1:
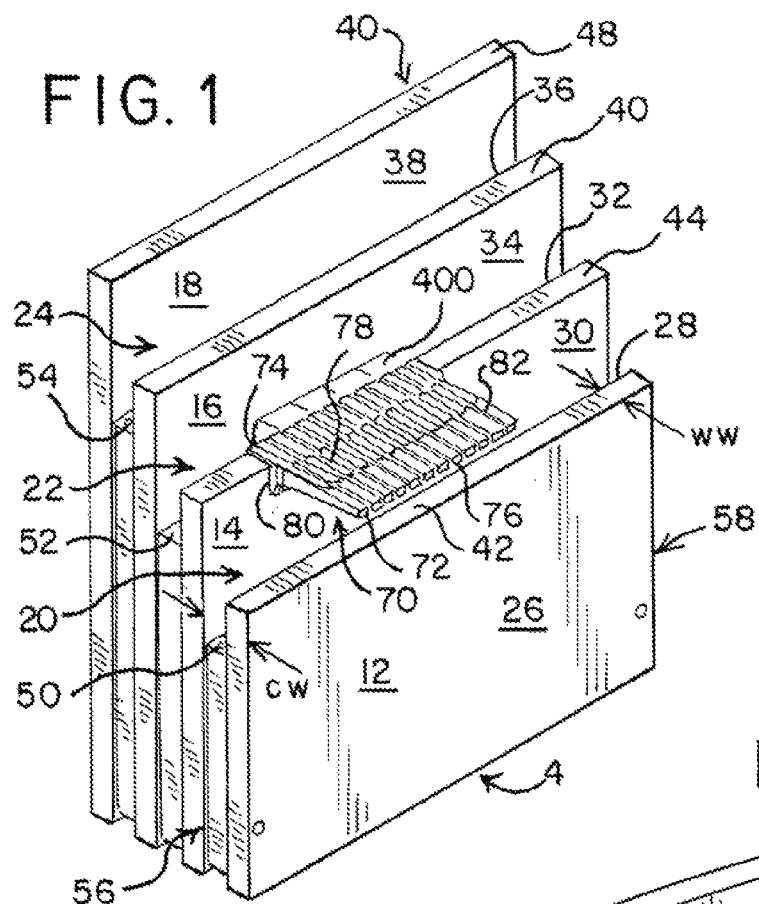
FIG. 1 is a perspective view of a linear wall element with an adjustable shelf applied thereto.
Figure 2:
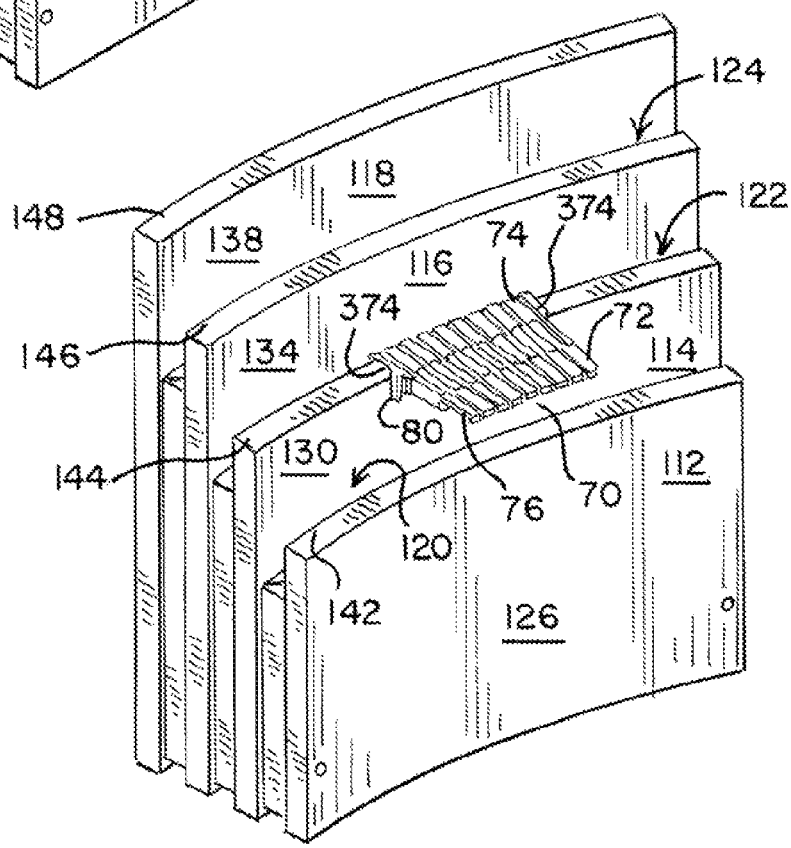
FIG. 2 is a perspective view of a curved wall element with an adjustable shelf applied thereto.

General:

The term "longitudinal" as used herein is intended to indicate a lengthwise direction, for example of a wall element, channel or wall. Similarly, the terms "front", "side", "back", "forwardly", "rearwardly", "upwardly" and "downwardly" as used herein are intended to indicate the various directions and portions of the wall element and furniture accessories coupled thereto as normally understood when viewed from the perspective of a user facing the wall element and interfacing with the accessories. It should be understood that the terms "mounted," "connected", "coupled," "supported by," and variations thereof, refer to two or more members or components that are joined, engaged or abutted, whether directly or indirectly, for example, by way of another component or member, and further that the two or more members, or intervening member(s) can be joined by being integrally formed, or by way of various fastening devices, including for example or without limitation, mechanical fasteners, adhesives, welding, press fit, bent-over tab members, etc. The term "plurality" means two or more. The terms "curved" and "linear" refer to the shape or configuration of a particular element or component in a plane view when being viewed from above, with "linear" being interchangeable with "straight." It should be understood that the use of numerical terms "first," "second," "third," etc., as used herein does not refer to any particular sequence or order of components; for example "first" and "second" auxiliary furniture components may refer to any sequence of such components, and is not limited to the first and second components of a particular configuration unless otherwise specified.

Wall Elements:

Referring to FIGS. 1, 2, 3, 5, 7, 9, 11, 13, 15, 16 and 21, a partition system 2 is configured with a plurality of wall elements 4, 6, 8, 10 which may be arranged end-to-end in various configurations. The wall elements may be curved or linear elements 4, 10, or combinations thereof, and may include various transition and corner elements 6, 8. In one embodiment, the wall elements 4, 10 are configured as stepped element, which defines a plurality of walls 12, 14, 16, 18, 112, 114, 116, 118 arranged at different heights, and a plurality of channels 20, 22, 24, 120, 122, 124 arranged at different heights. Each of the walls 12, 14, 16, 18, 112, 114, 116, 118 has opposite sidewalls 26, 28, 30, 32, 34, 36, 38, 40, 126, 128, 130, 132, 134, 136, 138, 140 defining a width (WW) of the respective wall and an upper support surface 42, 44, 46, 48, 142, 144, 146, 148. Likewise, each of the channels 20, 22, 24, 120, 122, 124 has a bottom 50, 52, 54, 150, 152, 154 and opposite sidewalls 28, 30, 32, 34, 36, 38, 128, 130, 132, 134, 136, 138 defining a width (CW) of the channel. Pairs of walls define the channels therebetween, with the sidewalls of spaced apart walls corresponding to the sidewalls of the channel formed therebetween. In one embodiment, the wall elements are configured with four walls and three channels, although it should be understood that more or less walls and channels may be used. In various embodiments, the heights HW1, HW2, HW3, and HW4 of the walls 12, 14, 16, 18, 112, 114, 116, 118 are 42 inches, 35.5 inches, 29.00 inches and 22.5 inches respectively in one embodiment, and 41.625 inches, 35.312 inches, 29.00 inches and 22.69 inches respectively in another embodiment, while the height of the bottom 50, 52, 54, 150, 152, 154 of the channels HC1, HC2 and HC3 are 31.16 inches, 24.85 inches and 18.54 inches respectively, although other heights may be suitable. The walls, when configured with a worksurface component secured thereto, provide a worksurface at a counter height, a kitchen counter height, a work table height and a continental table height respectively. The depth of the channels (height of front wall to bottom of channel) may be calculated, and is about 4.5 inches in one embodiment. In addition, the walls may have linear sides as shown, or may be tapered. The width (CW) of the channels 20, 22, 24, 120, 122, 124 is 2.00 inches, and preferably between 1 and 10 inches, while the width (WW) of the walls 12, 14, 16, 18, 112, 114, 116, 118 is also 2.00 inches, and preferably between 1 and 10 inches. It should be understood that other heights and widths may be suitable. Preferably, the widths of the walls are the same such that they are suited to support similar components, but varying widths may be employed. Likewise, the widths of the channels are the same to support similarly shaped and dimensioned components, but the widths may vary as deemed appropriate.

Figure 16:
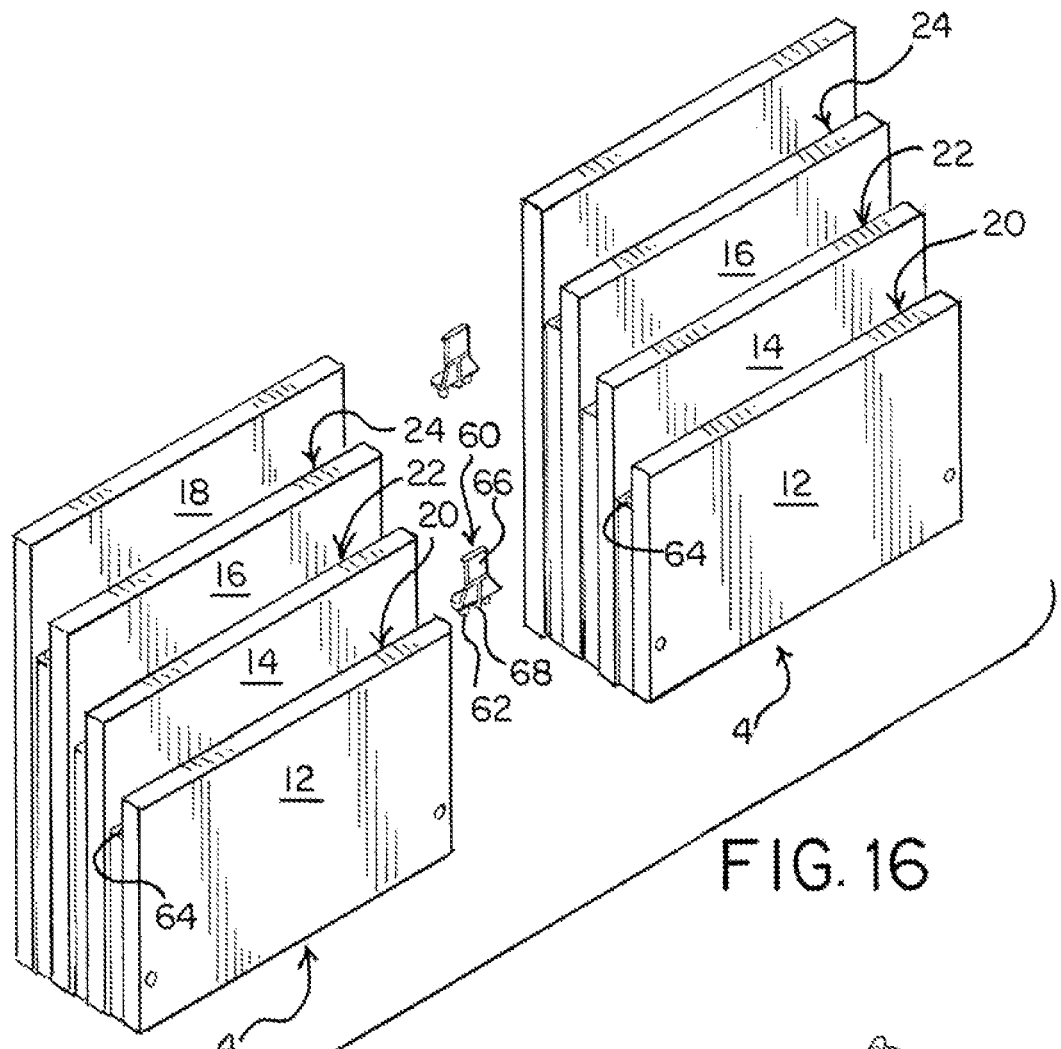
FIG. 16 is an exploded perspective view of a pair of wall elements and a pair of connectors.
Figure 17:
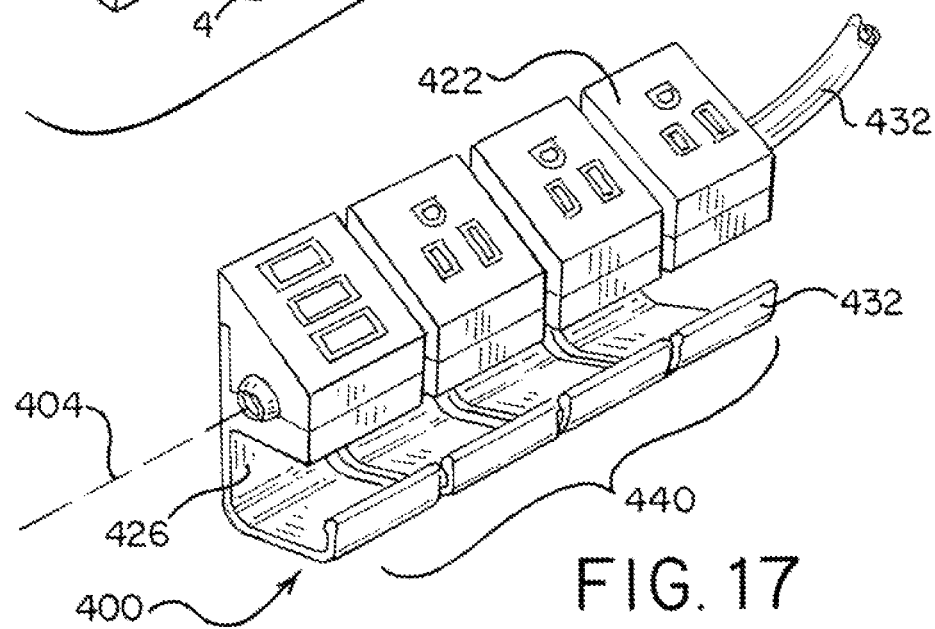
FIG. 17 is a perspective view of one embodiment of a power strip.
Figure 21:
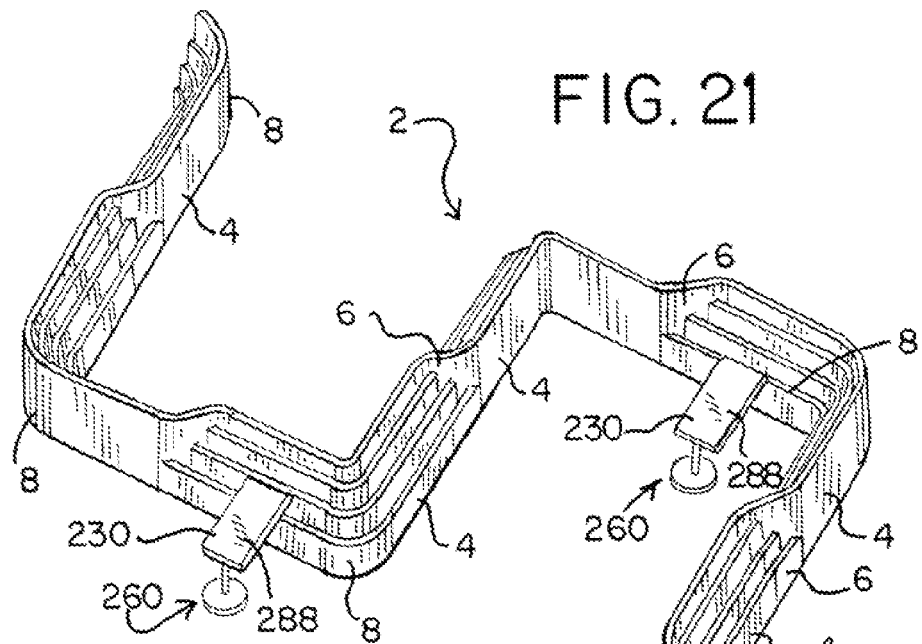
FIG. 21 is a perspective view of a partition assembly.
Figure 22:
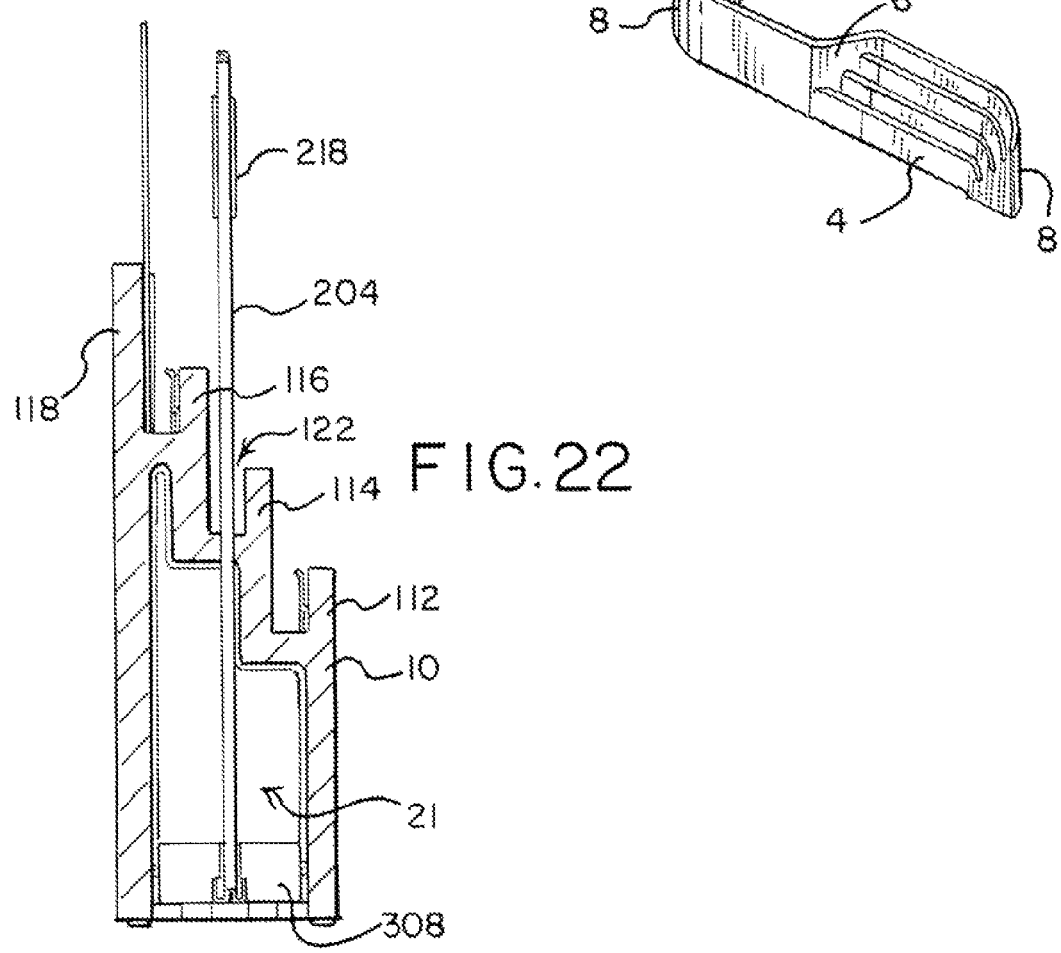
FIG. 22 is a cross-sectional view of the assembly shown in FIG. 7 taken along line 22-22.

The wall elements 4, 6, 8, 10 have opposite end surfaces 56, 58, 156, 158, which are abutted during assembly. Each wall element, otherwise referred to as a furniture "base," may be made of EPP plastic. The wall elements may be configured with an interior space 21 formed therein, for example along a bottom of the wall element as shown in FIG. 22. Referring to FIG. 16, adjacent wall elements may be joined by one or more connector elements 60. The connector elements are molded plastic in one embodiment, and include a pair of downwardly extending projections 62 that are received in openings 64 formed in the adjacent wall elements. The connector further includes an upwardly extending grippable portion 66, or handle, which may be grasped by a user to facilitate installation and extraction of the connector. The connector further includes a septum 68 extending downwardly between the projections. The septum helps to locate the connector relative to the wall elements. The septum keeps the connector from twisting relative to the wall elements. The septum may be omitted in various embodiments. In one embodiment, a pair of connectors 60 joins adjacent wall elements in the uppermost and lowermost channels 20, 24, 120, 124, although it should be understood that a connector may also be installed in an intermediate, or middle channel.

Adjustable Shelf:

Referring to FIGS. 1, 2 and 23-26, an adjustable shelf 70 is shown as including a plurality of elongated supports 72, each having an upper support surface 82. Each support 72 includes a mounting portion 74 formed at one end thereof and an opposite distal end portion 76. In one embodiment, the mounting portion 74 is configured as a claw having a base and opposing arms 80 defining a downwardly opening channel 81. The width of the channel 81 is sized to receive one of the walls 12, 14, 16, 18, 11, 114, 116, 118 with a snug fit. The distal end 76 is cantilevered away from the wall on which the shelf is mounted. The mounting portion and distal portion of each support are joined along an intermediate location between the mounting end and the distal free end with a flexible joint 78. Each mounting portion, except a pair of bookend mounting portions 374, are joined to a pair of distal end portions with a pair of flexible joints, and conversely, each distal end portion is joined to a pair of mounting portions with a pair of flexible joints. The mounting portions 374 are connected to a single distal end portion 76 via a flexible joint 78.

In one embodiment, the flexible joint 78 is configured as a flexible strip that allows relative rotation about a vertical axis between the supports, with the either the mounting portions 74 or the distal end portions 76 being moved away from each other, depending on whether the adjacent wall element is curved concavely or convexly, but with the strip resisting bending or flexing about a vertical axis. In this way, the supports 72 may configured with their mounting portions forming a linear channel (FIG. 1) for engagement with a linear wall, or with the mounting portions forming a curved channel (FIG. 2) for engagement with a curved wall. In the latter configuration, the adjustable shelf forms a segment about a virtual center spaced from the shelf. The shelf may be made of ABS plastic.

Backdrop:

Referring to FIGS. 3-6, a backdrop 84, 184 includes a screen element 86, 186 and at least one support bracket 88, and preferably a plurality of support brackets. The term "backdrop" refers to any type of screen or display, whether vertically self-supporting or supported by an internal or external frame. The backdrop may be made of wood, metal, plastic (e.g. acrylic), fiberglass, or other known and suitable materials, or combinations thereof, and may be covered (e.g., fabric) or uncovered. In one embodiment the backdrop is configured with an erasable whiteboard surface. The backdrop may function as a display surface for a projected image, whether from the front or back thereof. The backdrop may be planar (linear) 86 or curved 186.

Each support bracket 88 includes a base portion 90 and an upright portion 92. The base portion is configured as a U-shape, with a bottom 94 and a pair of upstanding leg portions 96, one of which may be elongated to form the upright portion 92. The backdrop is secured to the one or more support brackets with one or more fasteners. Alternatively, the backdrop may be secured to the support with adhesive, or interface by way of a groove or slit formed in the support. The backdrop 84, 184 may be secured to the upright 92 on an interior side above the bottom 94 of the base portion, or on an exterior side. In the latter configuration, the thickness of the support bracket (Ts) in combination with the thickness of the backdrop (Tbd) is substantially equal to the width (CW) of the channel, while in the first configuration, Ts is substantially equal to the width (CW) of the channel. The support brackets have a sufficiently small width (SW), in combination with the relatively large curvature of the channels 120, 122, 124, e.g., about 77 inches in one embodiment, enabling one configuration of support bracket to be used with both the linear and curved wall elements.

Figure 15:
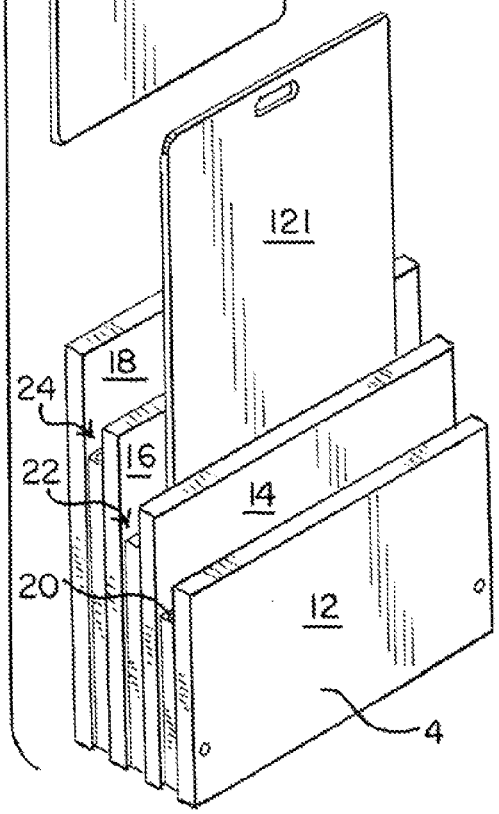
FIG. 15 is a linear wall element with a visualization board applied thereto.

Referring to FIG. 15, an alternative backdrop 121, including for example opposite erasable marker and tackable surfaces 123, 125, simply rests in the channel.

Support Stand:

Referring to FIGS. 7-10, a support stand 200 includes a weighted base portion 202, 302 and a pair of upstanding upright portions 204 extending upwardly from the base portion. The weight base portion includes in one embodiment a plurality of leveling feet 206 secured to a pair of interconnected ballast blocks 208, 308. The leveling feet are configured as independently adjustable leveling glides. Each ballast block includes a pair of handles 210, which may be gripped for moving the base portion. The ballast blocks 208, 308 may be filled with water, shot, or other appropriate and know ballast materials. The ballast 5 blocks may be filled on site so as to facilitate handling and shipping between locations. The ballast blocks are joined by a bridge element 212, which includes a leveling bubble 214 visible to an installer. The installer may adjust the leveling glides 206 using the bubble to achieve a substantially level assembly. The base portion 202, 302 and a lower portion of the uprights 204 are covered by a wall element 4, 10, which has an interior cavity shaped to receive the base portion and uprights. The uprights extend upwardly through an upper surface of the wall element, or base 4, 10, whether through a bottom of a channel as shown in FIGS. 7 and 9, or through a wall. The base may be curved 302 (FIG. 8) or linear 202 (FIG. 10) so as to be accommodated by a curved (FIG. 7) or linear (FIG. 9) wall element 10, 4. The base portion may be made of steel.

A cross bar 216 is secured to and bridges between the uprights 204. The cross bar is vertically adjustable along the uprights. For example, in one embodiment, a pair of locking clamps 218 are coupled to opposite ends of the cross bar. The locking clamps may be actuated between an unlocked and locked configuration, with a locking element acting as a brake providing friction between the clamp 218 and upright 204 to hold it in place. The upright may be configure with a plurality of circumferential grooves 220. The cross bar is configured with a connector arrangement 222 configured to interface with a display 224, such as a display monitor, TV, screen or other media interface. For example, in one embodiment, the cross bar is configured with an array of openings 222 arranged and shaped to mate with fasteners securing one or more displays thereto.

Figure 27:
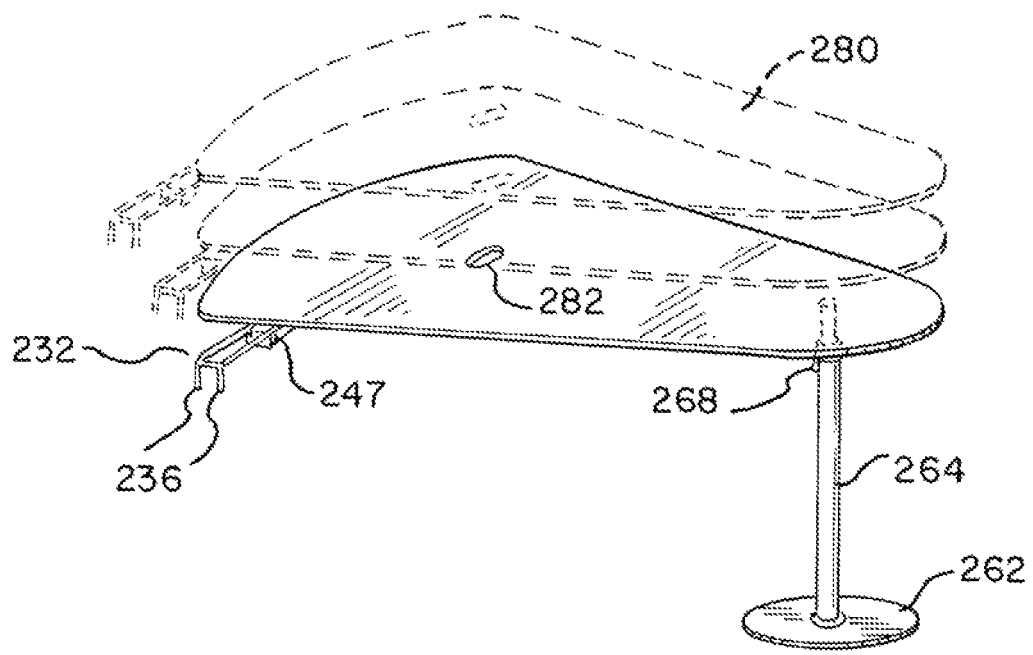
FIG. 27 is a perspective view of the worksurface assembly shown in FIG. 11 at different elevations with the support members at different telescoping positions.

Worksurface Assembly:

Referring to FIGS. 11-14, a worksurface assembly 230 is shown as including a pair of claws 232 having a base 234 and opposing arms 236 defining a downwardly opening channel 238, which is shaped and configured to engage a wall 12, 14, 16, 18, 112, 114, 116, 118. Each claw includes an arm 240 and mounting portion 242. In one embodiment, the mounting portion is configured as an insert portion shaped and sized to be slidably received in an elongated support member 244, configured in one embodiment as a tube. In another embodiment, the mounting portion is configured as a socket shaped to receive an end portion of the support member. As shown in FIG. 27, the mounting portion may be telescopically adjusted relative to the support member so as to adjust the location of the claw 232 relative to the support members. In one embodiment, the mounting portion is releasably secured to the support member, for example with a detent 246 and/or actuator or trigger 247. The user actuates the trigger 247 to release the mounting portion so that it can be extended or retracted to the appropriate length and position. In other embodiments the mounting portion is coupled to the support member with a friction fit, fasteners, adhesives, welding or combinations thereof, or is integrally formed therewith.

Figure 11:
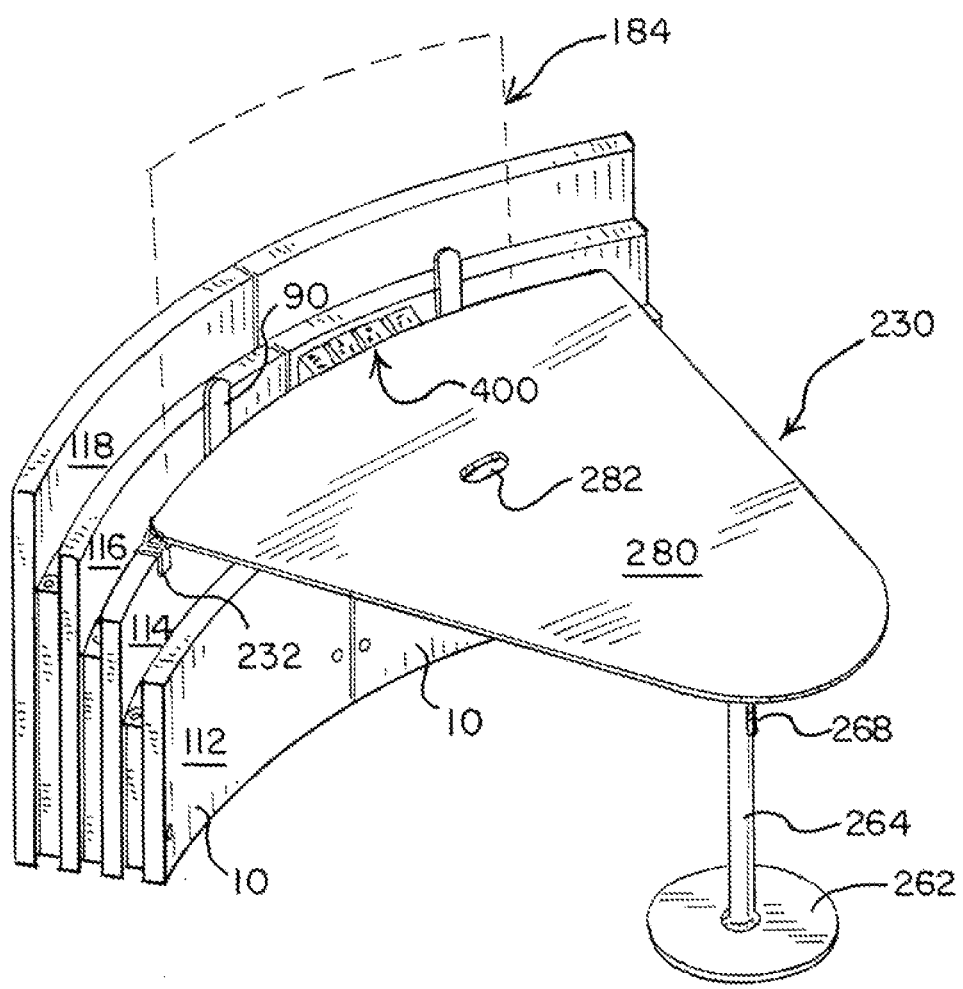
FIG. 11 is a perspective view of a curved wall assembly with a worksurface assembly supported thereon.
Figure 12:
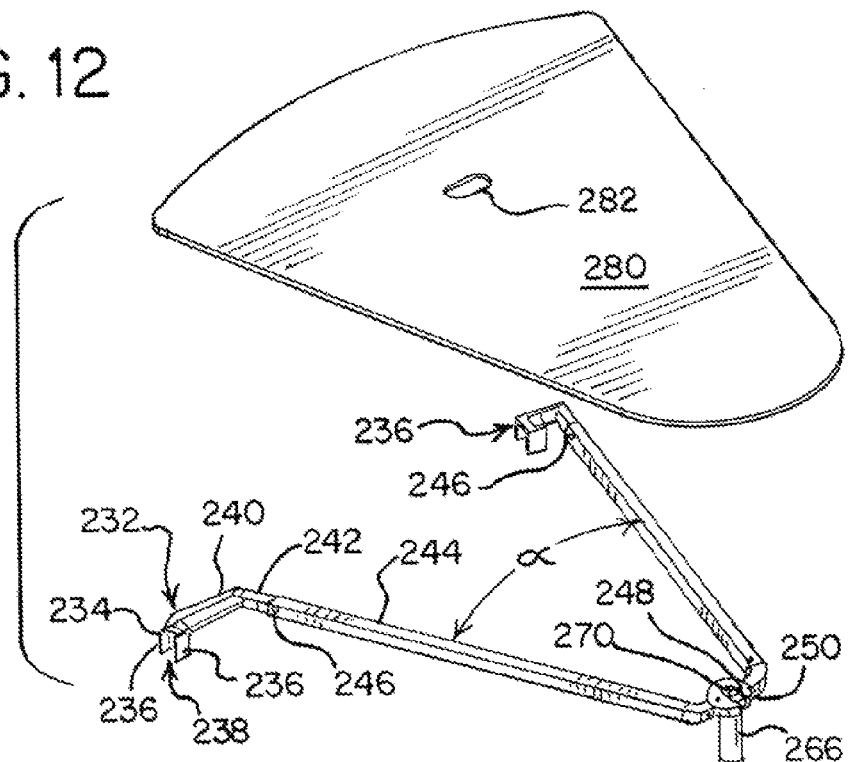
FIG. 12 is an exploded perspective view of the worksurface assembly shown in FIG. 11.

Referring to the embodiment of FIGS. 11 and 12, a pair of support members extend radially and laterally from the wall, and are angled relative to each other at an angle of α (e.g., 137.4 degrees), such that the channels of the claws are aligned with the underlying wall 114. Distal ends of the support members are coupled to a housing 248, for example by way of a spline, insert/socket interface, fasteners, welding, etc. The housing includes a coupling element, configured in one embodiment as a semicircular groove, with a mouth opening to one side thereof. The support members 244 may be arranged and angularly spaced such that the claws engage a contiguous walls on adjacent curved wall elements 10 (FIG. 11), or engage a curved wall on a single curved wall element 10.

A vertically adjustable leg 260 includes a base 262, a lower support tube 264 and an upper telescoping tube 266. A latch member 268 engages and secures the upper tube in a plurality of vertical positions. The upper end of the upper tube is configured with a mounting portion 270 configured to be engaged by the coupling element 250 of the housing. For example, in one embodiment, the mounting portion 270 includes a circular flange, which is dimensioned to be received through the mouth and into the groove so to provide a quick connector. In an alternative embodiment, the upper leg is configured with a groove and the coupling element is configured with a circular flange. The interface of the upper leg and coupling element may include a snap feature to secure the leg to the socket of the mounting portion.

A worksurface 280 is disposed on the support members and may be secured thereto with a plurality of fasteners. The worksurface may be configured in various different shapes including a sector or pie shape, with a rear curved edge 284 having substantially the same radius as the underlying wall 114. A bumper edge may be provided around the periphery of the worksurface. The worksurface may include an opening 282 therethrough which allows the user to grasp and lift the worksurface. At the same time, the opening may function as a raceway for various cords and the like to pass through the worksurface. In one embodiment, the opening is positioned proximate the center of gravity of the worksurface configured with a pair of support members and a coupling housing. The worksurface assembly is extremely portable and may be quickly and easily moved and deployed by one person.

The leg 260 may be vertically adjusted such that the worksurface 280 may be supported by any one of the plurality of the walls 112, 114, 116, 118, preferably with the worksurface in a substantially horizontal orientation. Moreover, the interface between the mounting portion 242 and the support member 244 may be telescoping such that the leg 260 may remain stationary even as the worksurface is supported by another wall. Alternatively, the leg is moved to accommodate the interface with the base.

Figure 13:
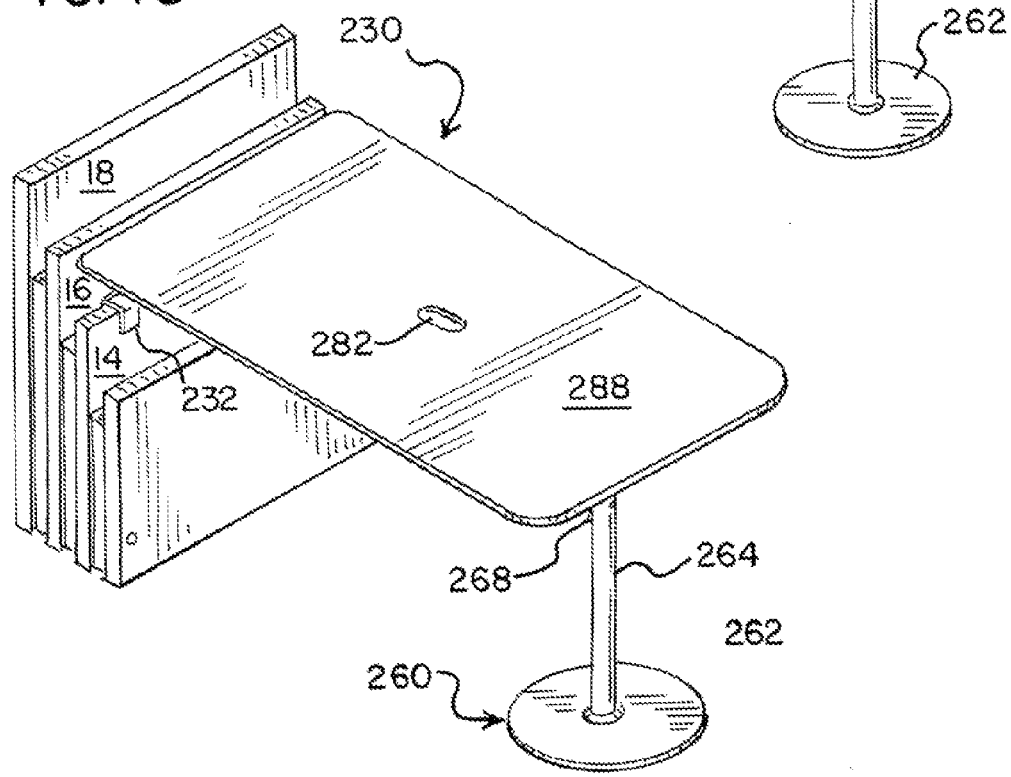
FIG. 13 is a perspective view of a linear wall assembly with a worksurface assembly supported thereon.
Figure 14:
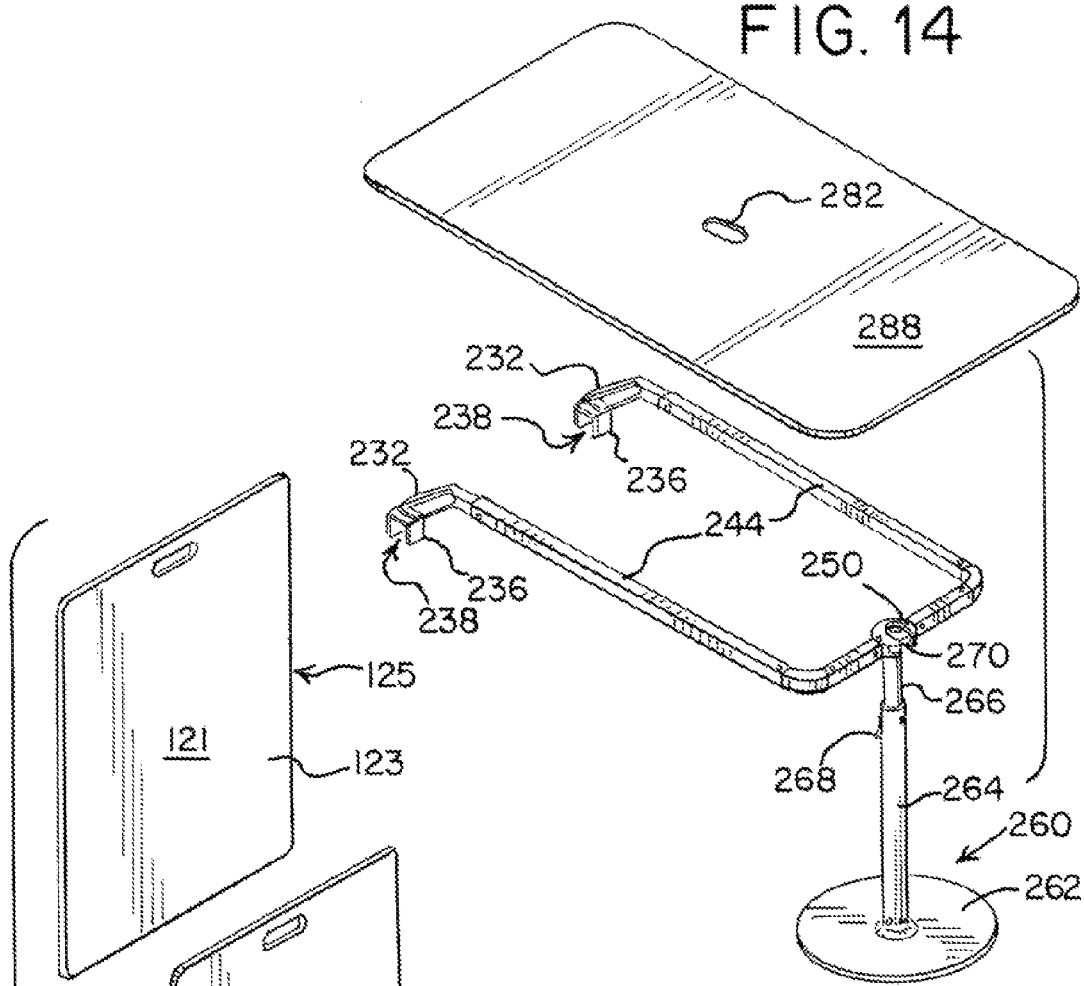
FIG. 14 is an exploded perspective view of the worksurface assembly shown in FIG. 13.

As shown in FIGS. 13 and 14, a worksurface assembly 330 includes a worksurface 288 having a substantially rectangular shape, with the support members being substantially parallel and with the channels of the claws being aligned so as to engage a linear wall 12, 14, 16, 18.

Power Strip:

Referring to FIGS. 17-20 and 28, a power strip 400, 600 is shown as including a plurality of power modules 402 disposed along a longitudinal axis 404. Each module has a width (t). The modules are joined by flexible joints 406 which provide for relative rotation between adjacent module about at least one axes 408. In one embodiment, the joint is configured as a bridge element having a hub portion 410 with a central through opening 412 and a pair end collars 414 or flanges. The hub portion 410 is received through an opening 416 or socket formed in an end wall 418 of the module, with the collar 414 trapped inside a module housing 420. In one embodiment, the bridge element may be made of a flexible, elastomeric material. Alternatively, due to the captured configuration and relative dimensions of the collars, hub and socket, adjacent modules may be permitted to rotate relative to each other about an axis 408 substantially perpendicular to the longitudinal axis 404. In addition, adjacent modules may rotate (in either rotational direction) relative to each other about the longitudinal axis 404. One or more power cords 432 is coupled to an end module, with various electrical conduits extending through the modules and bridges to provide power and/or data to the modules.

Each module housing includes a shell 424 and an outlet interface 422. The outlet interface 422 may equipped with a standard power outlet, including for example a HEYCO® Preassembled Cordset Component (Female Bridge—NEMA 5-15R), or one or more USB charging outlets (shown as three). The shell 424 and interface 422 each include a recess 416 that define the socket for the bridge when assembled. In this way, the bridge elements may be installed and captured by way of the interface being coupled to the shell, for example by way of a snap-fit.

At least one shell 424, and preferably each of the shells, includes an expansion component or device 440, which may be adjusted to vary the width (otherwise referred to as the thickness) of the power module. In one embodiment, the expansion device is configured as a biasing member, formed by a relative stiff and immobile downwardly extending leg 426 and a cantilevered spring portion 428, configured in one embodiment as an angled leg forming an angle β relative to the leg and an upstanding engagement portion 430 lying parallel to the leg. The engagement portion defines an engagement surface 432. The biasing member may be biased inwardly to adjust the relative width or thickness of the power module (see, e.g., t, t1, t2 and t3; FIG. 18).

Figure 28:
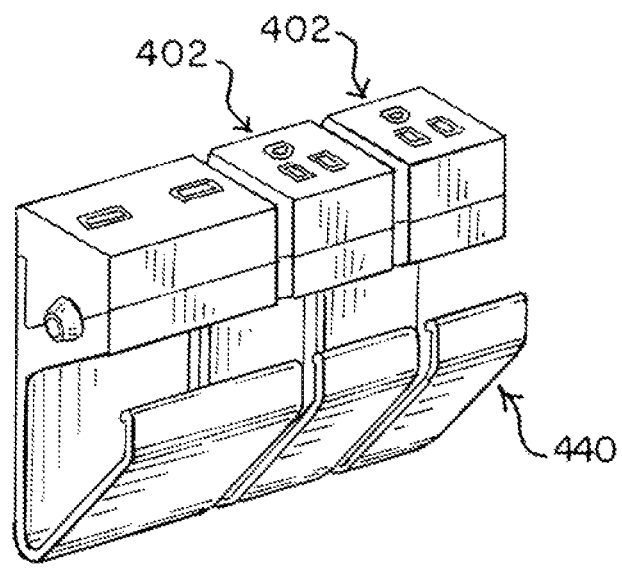
FIG. 28 is an alternative embodiment of a power strip.

Referring to the embodiment of FIG. 28, the module housing need not be uniform size, but may be configured to support various configurations of outlets, for example having USB ports 431 arranged side to side. A front portion of the housing is chamfered so as to provide space for the expansion component.

In operation, the power strip 400 may be disposed in either a curved or linear channel 20, 22, 24, 120, 122, 124, with the engagement surface 432 of the expansion member engaging one side wall 28, 30, 32, 34, 36, 38, 128, 130, 132, 134, 136, 138 of the channel and biasing the power strip against an opposite side wall. The bridge member allows the user to manipulate the power strip to a curved configuration for disposal in the curved channel 120, 122, 124. The power cord may run along the channel, or may be routed through one or more internal raceways in the base.

Assembly:

It should be understood that the term "auxiliary furniture component" refers to any component other than the base or wall element, and includes one or more of the accessories disclosed described herein, including without limitation the power strip, adjustable shelf, backdrop, support stand and worksurface assembly, including the claws. As shown in FIGS. 1, 11 and 18, the various auxiliary furniture components may be co-located at the same location on the base. For example, the power strip 400 may be installed alone in a channel, be installed in the same channel in front of a backdrop (FIG. 11) or behind an adjustable shelf (FIG. 1) or worksurface assembly (FIG. 11), or be installed in the same channel in front of a backdrop and in back of either an adjustable shelf or worksurface assembly (FIG. 11). In the first instance, and referring to FIG. 18, the expansion device is compressed to vary the width of the module housing, for example the expansion device 440 may be compressed from an uncompressed thickness (t) a first predetermined amount (d1) so as to maintain a snug fit of the power strip, having thickness t1, in the channel.

In a second configuration, wherein two auxiliary components occupy the same channel space, the expansion device 440 is compressed a second predetermined amount (d2) giving the power strip a width or thickness t2, or the expansion device 440 may be compressed different second predetermined amounts d2' or d2" depending on the relative thickness of the second auxiliary furniture component (shelf or worksurface claw v. backdrop), such that the thickness of the two auxiliary furniture components in combination is substantially the same as the channel width CW. In one embodiment, the expansion device 440 biases the first auxiliary furniture component (e.g., the power strip) against one side wall of the channel and against the second auxiliary furniture component.

In a third configuration, where at least three auxiliary components occupy the same channel space, the expansion device 440 is compressed a third predetermined amount (d3) giving the power strip a width or thickness t3, such that the power strip is snugly secured in the channel, with the thickness of the three auxiliary furniture components in combination being substantially the same as the channel width CW. It should be understood that t>t1>t2>t3. In this embodiment, the first auxiliary furniture component would be biased between the second and third auxiliary furniture components, although it should be understood that the second and third auxiliary furniture components may be disposed on one side, with the first auxiliary furniture component engaging a side wall of the channel. It should be understood that auxiliary furniture components other than the power strip may be configured with one or more expansion devices, including without limitation the backdrop assembly, the shelf assembly, the worksurface assembly, a lighting assembly disposed in the channel, or combinations thereof.

As noted above, the worksurface may be supported by any one of the plurality of the walls 112, 114, 116, 118, preferably with the worksurface in a substantially horizontal orientation, with the support leg 260 being vertically adjusted, but remaining in the same location. Instead, the mounting portion 242 may be extended or retracted relative to the support member 244 such that the claws are properly positioned to engage the corresponding wall for a particular selected height. The worksurface may be reconfigured by actuating the three adjustment devices, one on the leg and two on the claws.

Although the present invention has been described with reference to preferred embodiments, those skilled in the art will recognize that changes may be made in form and detail without departing from the spirit and scope of the invention. As such, it is intended that the foregoing detailed description be regarded as illustrative rather than limiting and that it is the appended claims, including all equivalents thereof, which are intended to define the scope of the invention.

What is claimed is:

1. A furniture assembly comprising:
   a base comprising a plurality of walls each having an upper edge with a different height, the plurality of walls spaced horizontally from each other and arranged front to back to define one or more channels therebetween;
   a claw defining a downwardly opening claw channel, wherein one of said upper edges is received in said claw channel;
   a support member coupled to said claw and extending laterally from said plurality of walls;
   a vertically adjustable leg supporting said support member at a location laterally spaced from said base; and
   a worksurface supported by said support member,
   wherein said claw is adapted to engage any of said plurality of walls, and wherein said leg is adjustable to a plurality of heights so as to maintain said worksurface in a substantially horizontal configuration regardless of which of said upper edges is engaged by said claw.

2. The furniture assembly of claim 1 comprising a second claw, wherein the claw and the second claw define a pair of claws, and wherein said support member comprises at least a pair of support arms respectively coupled to said pair of claws.

3. The furniture assembly of claim 2 wherein said support arms comprise distal end portions joined to a housing, wherein said housing is coupled to said leg.

4. The furniture assembly of claim 2 wherein said pair of claws are slideably coupled to respective proximal end portions of said support arms opposite distal end portions.

5. The furniture assembly of claim 1 wherein said plurality of walls are curved.

6. The furniture assembly of claim 5 wherein said worksurface has a sector shape.

7. The furniture assembly of claim 1 further comprising an auxiliary furniture component disposed in one of said one or more channels behind a rear edge of said worksurface.

8. The furniture assembly of claim 7 wherein said auxiliary furniture component comprises one of a backdrop or power strip.

9. The furniture assembly of claim 1 wherein said plurality of walls are linear.

10. A furniture assembly comprising:
    a base comprising a plurality of walls having support surfaces arranged at a plurality of different heights, wherein said plurality of walls are horizontally spaced from each other and arranged front to back in a stepped configuration;
    a support member adapted to be supported by any one of said support surfaces, said support member extending laterally from said base;
    a worksurface supported by said support member; and
    a vertically adjustable leg positioned at a location laterally spaced from said base, wherein said vertically adjustable leg supports said worksurface and is adjustable to a plurality of heights so as to maintain said worksurface in a substantially horizontal configuration regardless of which of said support surfaces is supporting said support member.

11. The furniture assembly of claim 10 further comprising a claw engaging one of said support surfaces, wherein said support member is coupled to said claw, wherein said claw defines a downwardly opening channel, and said plurality of walls each defining one of said support surfaces, wherein one of said plurality of walls is received in said channel.

12. The furniture assembly of claim 11 comprising a second claw, wherein the claw and the second claw define a pair of claws, and wherein said support member comprises at least a pair of support arms coupled to said pair of claws.

13. The furniture assembly of claim 12 wherein said support arms comprise distal end portions joined to a housing, wherein said housing is coupled to said leg.

14. The furniture assembly of claim 13 wherein one of said housing and a mounting portion of said leg comprises a circular flange configured to be slideably received in a groove.

15. The furniture assembly of claim 12 wherein said pair of claws are slideably coupled to end portions of said support arms.

16. The furniture assembly of claim 11 wherein each of said plurality of walls comprises opposite sidewalls and wherein said base comprises at least one channel formed adjacent one of said plurality of walls, said at least one channel defined in part by one of said opposite sidewalls, and further comprising an auxiliary furniture component disposed in said at least one channel behind a rear edge of said worksurface.

17. The furniture assembly of claim 16 wherein said auxiliary furniture component comprises one of a backdrop or power strip.

18. The furniture assembly of claim 10 wherein said base is curved.

19. The furniture assembly of claim 18 wherein said worksurface has a sector shape.

20. The furniture assembly of claim 10 wherein said vertically adjustable leg is coupled to said support member.

21. The furniture assembly of claim 10 wherein said base is linear.

* * * * *